(12) United States Patent
Imai

(10) Patent No.: US 7,439,517 B2  
(45) Date of Patent: Oct. 21, 2008

(54) RESIDUAL CHARGE ERASING METHOD FOR SOLID STATE RADIATION DETECTORS AND RADIATION IMAGE RECORDING/READOUT APPARATUS

(75) Inventor: Shinji Imai, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/590,858

(22) Filed: Nov. 1, 2006

(65) Prior Publication Data

US 2007/0096035 A1    May 3, 2007

(30) Foreign Application Priority Data

Nov. 1, 2005    (JP) ............................. 2005-318707

(51) Int. Cl.  
*G01T 1/24*    (2006.01)

(52) U.S. Cl. ................................. 250/370.12

(58) Field of Classification Search ................................. 250/370.01–370.15  
See application file for complete search history.

(56) References Cited

U.S. PATENT DOCUMENTS

| | | | | |
|---|---|---|---|---|
| 5,661,309 A | * | 8/1997 | Jeromin et al. | 250/580 |
| 5,932,301 A | * | 8/1999 | Kamiyama et al. | 427/558 |
| 6,268,614 B1 | * | 7/2001 | Imai | 250/591 |
| 6,376,857 B1 | * | 4/2002 | Imai | 250/591 |
| 6,828,539 B1 | * | 12/2004 | Kuwabara | 250/208.1 |
| 2001/0006545 A1 | * | 7/2001 | Kim | 378/98.8 |
| 2004/0183025 A1 | * | 9/2004 | Sato | 250/370.11 |

* cited by examiner

*Primary Examiner*—David P. Porta  
*Assistant Examiner*—Kiho Kim  
(74) *Attorney, Agent, or Firm*—Sughrue Mion, PLLC

(57) ABSTRACT

In a solid state radiation detector which includes an electrostatic recording section having a photoconductive layer that shows conductivity when exposed to recording light, and is constructed to receive recording light representing image information to record the image information in the detector, and to output image signals representing the recorded image information, the photoconductive layer is swept by an amount of major carrier greater than or equal to an amount of current that flows through the photoconductive layer at the time of recording to facilitate the recombination of minor carriers (residual charges) accumulated in the photoconductive layer.

9 Claims, 1 Drawing Sheet

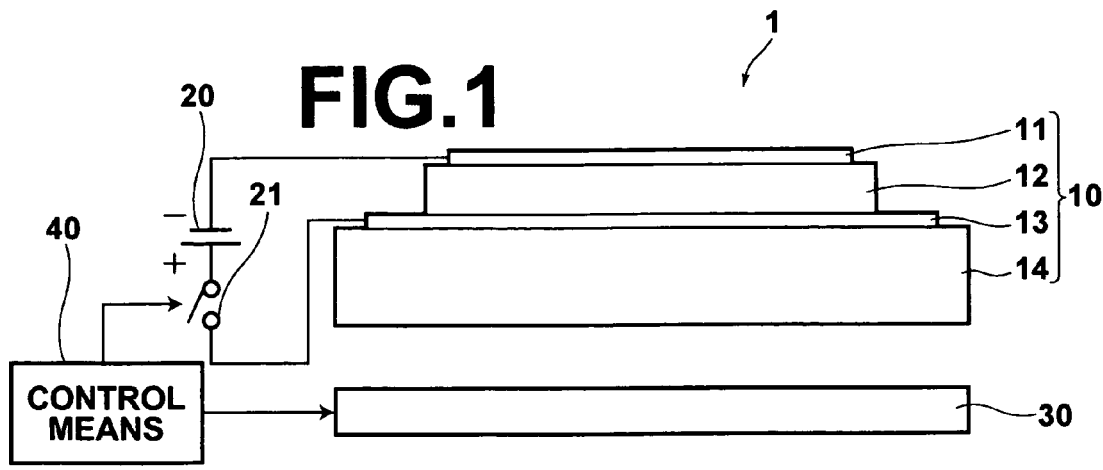
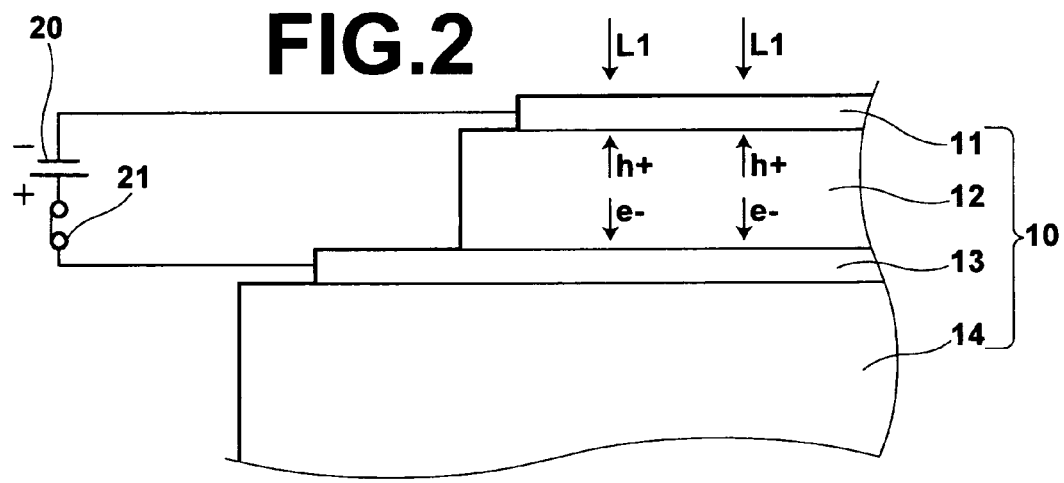
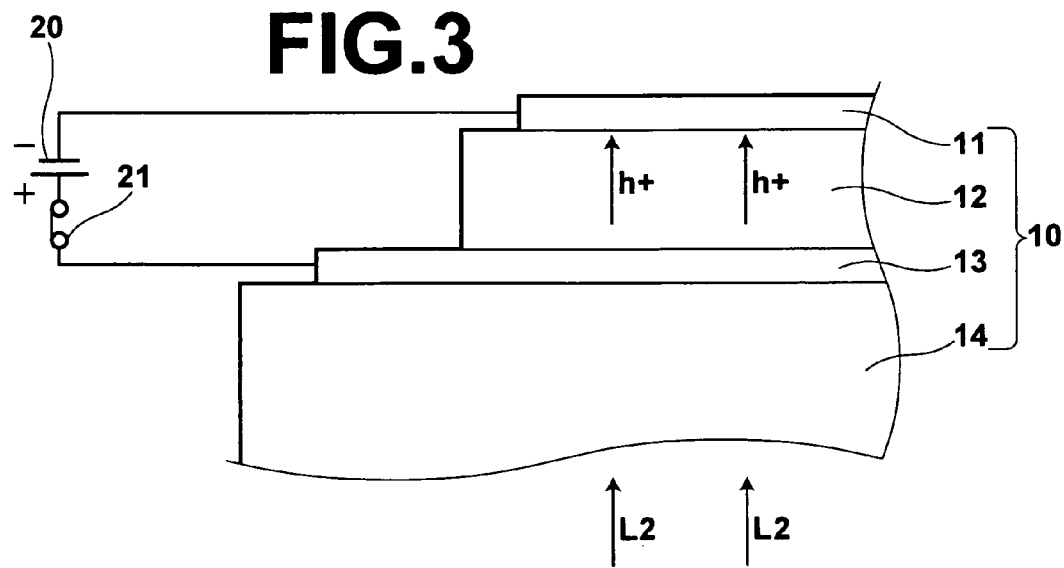

RESIDUAL CHARGE ERASING METHOD FOR SOLID STATE RADIATION DETECTORS AND RADIATION IMAGE RECORDING/READOUT APPARATUS

BACKGROUND OF THE INVENTION

1. Field of the Invention

The present invention relates to a residual charge erasing method for a solid state radiation detector. The solid state radiation detector includes an electrostatic recording section having a photoconductive layer that shows conductivity when exposed to recording light, and is constructed to receive recording light representing image information to record the image information therein and to output image signals representing the recorded image information. More specifically, the present invention relates to a residual charge erasing method for erasing unwanted charges remaining in the photoconductive layer of such solid state radiation detectors. The present invention also relates to a radiation image recording/readout apparatus.

2. Description of the Related Art

Today, in X-ray (radiation) imaging for medical diagnosis and the like, various types of X-ray image recording/readout systems are proposed and put into practical use. Such system uses a solid state radiation detector(detector that employs semiconductors in the main section) as the X-ray image information recording means, and X-rays transmitted through a subject are detected by the solid state detector to obtain image signals representing the X-ray image of the subject.

Various types of detectors are also proposed as the solid state radiation detectors for use in such systems. For example, from the aspect of charge generating process in which X-rays are converted to charges, photoelectric conversion type solid state detectors, direct conversion type solid state detectors, and the like are proposed. In the photoelectric conversion type solid state detector, fluorescent light emitted from a phosphor when X-rays are irradiated thereon is detected by a photoconductive layer to obtain signal charges, which are temporarily stored in the storage section, then the stored charges are outputted after converted to image signals (electrical signals). In the direct conversion type solid state detector, signal charges generated in the photoconductive layer when X-rays are irradiated thereon are collected by charge collection electrodes and temporarily stored in the storage section, thereafter the stored charges are outputted after converted to electrical signals. In the solid state detector of this type, the photoconductive layer and the charge collection electrodes constitute the main section.

From the aspect of charge readout process in which the stored charges are read out to outside, optical readout type detectors in which the stored charges are read out by irradiating readout light (readout electromagnetic wave) on the detector, TFT readout type detectors as described, for example, in U.S. Pat. No. 6,828,539 in which the charges are read out by scan driving TFTs (thin film transistors) connected to the storage section, and the like are proposed.

A modified direct conversion type solid state detector is also proposed by the inventor of the present invention in U.S. Pat. No. 6,268,614. The modified direct conversion type solid state detector proposed by the inventor is a direct conversion/optical readout type solid state detector. The detector includes the following layers arranged in the order listed below: a recording photoconductive layer that shows conductivity when exposed to recording light (X-rays, fluorescent light generated by the irradiation of X-rays, and the like); a charge transport layer that acts as substantially an insulator against charges having the same polarity as latent image charges and as substantially a conductor for transport charges having the opposite polarity to that of the latent image charges; and a readout photoconductive layer that shows conductivity when exposed to readout light. Here, signal charges (latent image charges) that represent image information are stored in the interface between the recording photoconductive layer and charge transport layer. An electrode layer (first conductive layer or second conductive layer) is provided on each side of the three-layer composite. In this type of solid state detector, the recording photoconductive layer, charge transport layer, and readout photoconductive layer constitute the main section of the detector.

Basically, after the latent image charges are read out, each of the solid state detectors described above is supposed to have no latent image charges remaining therein, and to be directly usable for the next recording. There may be cases, however, that the latent image charges are not read out completely and some of them remain in the detector. Further, when recording a latent image in the solid state detector, a high voltage is applied to the detector before the irradiation of recording light, which causes dark currents to flow and unwanted charges (dark current charges) are also accumulated in the detector. Still further, it is known that unwanted charges are accumulated in the detector due to various other reasons prior to the irradiation of recording light.

The residual charges including charges not read out from the detector and unwanted charges accumulated in the detector prior to the irradiation of recording light are added to the latent image charges stored in the detector through the irradiation of recording light. Consequently, when the electrostatic latent image charges are readout from the solid state detector, the output signal includes the signal components of the residual charges, as well as those based on the latent image charges representing image information, causing the problems of residual image or degraded signal-to-noise ratio.

For this reason, the inventor of the present invention has proposed a residual image erasing method in U.S. Pat. No. 6,268,614, in which erasing light is irradiated on the solid state detector prior to the irradiation of recording light while the voltage is being applied to the detector to erase the residual charges accumulated in the storage section in advance.

It is difficult, however, to completely erase the residual charges by the conventional method, and more effective residual charge erasing methods are needed.

The present invention has been developed in view of the circumstances described above, and it is an object of the present invention to provide a more effective residual charge erasing method for a solid state radiation detector which includes an electrostatic recording section having a photoconductive layer that shows conductivity when exposed to recording light, and is constructed to receive recording light representing image information to record the image information therein, and to output image signals representing the recorded image information. It is a further object of the present invention to provide a radiation image recording/readout apparatus.

SUMMARY OF THE INVENTION

The residual charge erasing method for a solid state radiation detector of the present invention is a method for erasing residual charges remaining in a solid state radiation detector which includes an electrostatic recording section having a photoconductive layer that shows conductivity when exposed to recording light, and is constructed to receive recording light representing image information to record the image information therein and to output image signals representing the recorded image information, wherein residual charges remaining in the solid state radiation detector are erased by passing an amount of major carrier through the photoconductive layer, the amount of major carrier being greater than or equal to an amount of current that flows through the photoconductive layer at the time of recording.

In the residual charge erasing method for a solid state radiation detector of the present invention, the photoconductive layer may be formed mainly of amorphous selenium. Here, the residual charges remaining in the solid state radiation detector may be erased by passing an amount of hole-current density greater than or equal to $1 \times 10^{-8}$ A/cm$^2$ through the photoconductive layer.

Preferably, here, an amount of hole-current density greater than or equal to $1 \times 10^{-6}$ A/cm$^2$ is passed through the photoconductive layer.

The radiation image recording/readout apparatus of the present invention is an apparatus including:

a solid state radiation detector which includes an electrostatic recording section having a photoconductive layer that shows conductivity when exposed to recording light, and is constructed to receive recording light representing image information to record the image information therein and to output image signals representing the recorded image information;

a voltage application means for applying a voltage to the photoconductive layer of the solid state radiation detector;

a band-gap light irradiation means for irradiating band-gap light on the solid state radiation detector; and a control means for controlling the voltage application means and band-gap light irradiation means such that an amount of major carrier flows through the photoconductive layer, the amount of major carrier being greater than or equal to an amount of current that flows through the photoconductive layer at the time of recording.

In the radiation image recording/readout apparatus of the present invention, the photoconductive layer may be formed mainly of amorphous selenium. Here, the control means may be a means for controlling the voltage application means and band-gap light irradiation means such that an amount of hole-current density greater than or equal to $1 \times 10^{-8}$ A/cm$^2$ flows through the photoconductive layer.

Preferably, here, the control means controls the voltage application means and the band-gap light irradiation means such that an amount of hole-current density greater than or equal to $1 \times 10^{-6}$ A/cm$^2$ flows through the photoconductive layer.

The referent of "solid state radiation detector" as used herein means a detector that detects radiation representing image information of a subject and outputs image signals representing the radiation image of the subject. More specifically, it converts the radiation irradiated thereon to charges directly or after converted to light, stores the charges in the storage section, and thereafter outputs the stored charges, thereby image signals representing the radiation image of the subject are obtained.

There are various types of solid state radiation detectors. For example, from the aspect of charge generating process in which the radiation is converted to charges, photoelectric conversion type solid state radiation detectors, direct conversion type solid state radiation detectors and the like are available. In the photoelectric conversion type solid state radiation detectors, signal charges obtained by the photoelectric conversion device by detecting fluorescent light emitted from a phosphor when exposed to radiation are temporarily stored in the storage section of the photoelectric conversion device, and the stored signal charges are outputted after converted to image signals (electrical signals). In the direct conversion type solid state detectors, signal charges generated in the radiation conductor when exposed to radiation are collected by charge collection electrodes and temporarily stored in the storage section, thereafter the stored charges are outputted after converted to electrical signals. From the aspect of charge readout process in which the stored charges are read out to outside, TFT readout type detectors in which the charges are read out by scan driving TFTs (thin film transistors) connected to the storage section, optical readout type detectors in which the charges are read out by irradiating readout light (readout electromagnetic wave) on the detector, and the like are available. Further, a modified direct conversion type solid state radiation detector, which is a direct conversion/optical readout type detector, is proposed by the inventor of the present invention in U.S. Pat. Nos. 6,828,539 and 6,268,614.

The referent of "an amount of current that flows through the photoconductive layer at the time of recording" as used herein means an amount of current that flows through the area of the photoconductive layer corresponding to the region where no shielding is provided on the side of the solid state radiation detector on which radiation is incident at the time of recording. Here, the referent of "an amount of current" means the total amount of major and minor carries that flow through the photoconductive layer.

The amount of current that flows through the photoconductive layer at the time of recording in the solid state radiation detector varies with the imaging conditions including the intensity of the radiation to be irradiated, material of the photoconductive layer of the solid state radiation detector and the like, so that "an amount of major carrier greater than or equal to an amount of current that flows through the photoconductive layer at the time of recording" also varies with the imaging conditions described above.

Further, for the photoconductive layer, the referent of "formed mainly of amorphous selenium" as used herein means a photoconductive layer in which amorphous selenium occupies the largest amount in weight percent among the components constituting the photoconductive layer.

According to the residual charge erasing method for a solid state radiation detector and the radiation image recording/readout apparatus of the present invention, in a solid state radiation detector which includes an electrostatic recording section having a photoconductive layer that shows conductivity when exposed to recording light, and is constructed to receive recording light representing image information to record the image information therein and to output image signals representing the recorded image information, the photoconductive layer is swept by a large amount of major carrier which is greater than or equal to the amount of current that flows through the photoconductive layer at the time of recording. This facilitates the recombination of the minor carriers (residual charges) accumulated in the photoconductive layer, so that the residual charges may be erased effectively.

Here, if the photoconductive layer is formed mainly of amorphous selenium, an amount of current density around $1 \times 10^{-9}$ A/cm$^2$ is expected to flow through the photoconductive layer at the time of recording. Thus, the residual charges may be erased effectively by passing an amount of hole-current density, which is greater than or equal to $1 \times 10^{-8}$ A/cm$^2$, i.e., ten times of an amount of current that flows through the photoconductive layer at the time of recording, through the photoconductive layer.

Generally, the recombination probability of minor carriers (residual charges) accumulated in the photoconductive layer is around a few tenth of a percent. Thus, the residual charges may be almost completely erased by passing an amount of hole-current density, which is greater than or equal to $1\times10^{-6}$ A/cm$^2$, i.e., a thousand times of an amount of current density that flows through the photoconductive layer at the time of recording, through the photoconductive layer.

BRIEF DESCRIPTION OF THE DRAWINGS

FIG. 1 is a configuration diagram of the radiation image recording/readout apparatus according to an embodiment of the present invention.

FIG. 2 is a drawing for explaining the operation of the radiation image recording/readout apparatus at the time of recording a radiation image.

FIG. 3 is a drawing for explaining the operation of the radiation image recording/readout apparatus at the time of erasing residual charges.

DESCRIPTION OF THE PREFERRED EMBODIMENTS

Hereinafter, exemplary embodiments of the present invention will be described in detail with reference to accompanying drawings.

The radiation image recording/readout apparatus 1 according to the present embodiment is constituted by: a solid state radiation detector 10 which includes an electrostatic recording section having a photoconductive layer 12 that shows conductivity when exposed to X-rays, and is constructed to receive recording light representing image information to record the image information therein and to output image signals representing the recorded image information; a voltage application means for applying a voltage to the photoconductive layer 12 of the solid state radiation detector 10; a band-gap light irradiation means 30 for irradiating band-gap light on the solid state radiation detector 10; and a control means 40 for controlling the voltage application means and band-gap light irradiation means 30 such that an amount of major carrier flows through the photoconductive layer, the amount of major carrier being greater than or equal to an amount of current that flows through the photoconductive layer at the time of recording.

The solid state radiation detector 10 includes a glass substrate 14 on which the following layers are arranged in the order listed below: a first conductive layer 11; the photoconductive layer 12 that shows conductivity when exposed to X-rays; and a second conductive layer 13 formed of a-Si TFTs.

The first conductive layer 11 may be made of any material as long as it is transparent to X-rays, and, for example, a gold film and the like may be used.

The photoconductive layer 12 is formed of amorphous selenium having high quantum efficiency with low dark current. In the present embodiment, the thickness of the photoconductive layer is 200 μm.

The second conductive layer 13 is formed of TFTs, each corresponding to each pixel, and the output line of each TFT is connected to a signal detection means (not shown). Further, the control line for each TFT is connected to a TFT control means (not shown).

The voltage application means includes: a high voltage power source 20; and a switch 21, one of the terminals of which is connected to the positive side of the high voltage power source 20, and the other of which is connected to the second conductive layer 13.

In the present embodiment, amorphous selenium is used for the photoconductive layer 12 of the solid state radiation detector 10. The wavelength of the band-gap light corresponding to the amorphous selenium is in the range of 350 to 590 nm. Therefore, a light source capable of irradiating light (band-gap light) with the wavelength described above is used as the band-gap light irradiation means 30.

The band-gap light irradiation means 30 is disposed at a place that enable the band-gap light irradiation means 30 to irradiate the band-gap light on the surface of the solid state radiation detector 10 opposite to the surface on which X-rays are irradiated.

Hereinafter, the operation of the radiation image recording/readout apparatus 1 will be described. FIG. 2 is a drawing for explaining the operation of the radiation image recording/readout apparatus 1 at the time of radiation image recording, and a FIG. 3 is a drawing for explaining the operation of the radiation image recording/readout apparatus 1 at the time of erasing residual charges.

When recording a radiation image, the switch 21 is closed to apply a high voltage between the first conductive layer 11 and the second conductive layer 13, as shown in FIG. 2. While the electric field is being formed between the first conductive layer 11 and the second conductive layer 13, when X-rays L1 are irradiated on the photoconductive layer 12, charge pairs are generated in the photoconductive layer 12 and latent image charges according to the amount of charge pairs are stored in the second conductive layer 13. When reading out the stored latent image charges, the TFTs in the second conductive layer 13 are sequentially driven to output an image signal, which is based on the latent image charge corresponding to each pixel, through the output line. These image signals are detected by the signal detection means (not shown), and the electrostatic latent image represented by the latent image charges is read out.

As shown in FIG. 3, when erasing residual charges, the switch 21 is closed to apply a high voltage between the first conductive layer 11 and the second conductive layer 13, as in the time of recording.

While the electric field is being formed between the first conductive layer 11 and the second conductive layer 13, when band-gap light L2 is irradiated on the area adjacent to the interface between the photoconductive layer 12 and the conductive layer 13, charge pairs are generated in the area adjacent to the interface between the photoconductive layer 12 and the conductive layer 13. The electrons of the charge pairs are immediately absorbed by the second conductive layer 13 connected to the positive electrode, so that only the holes, which are the major carriers of the amorphous selenium, flow through the photoconductive layer 12.

When amorphous selenium is used as the photoconductive layer 12, an amount of current density around $1\times10^{-9}$ A/cm$^2$ is expected to flow through the photoconductive layer 12 at the time of recording. Generally, the recombination probability of minor carriers (residual charges) accumulated in the photoconductive layer 12 is around a few tenth of a percent. Thus, the residual charged may be almost completely erased by passing an amount of hole-current density, which is greater than or equal to $1\times10^{-6}$ A/cm$^2$, i.e., a thousand times of an amount of current that flows through the photoconductive layer 12 at the time of recording, through the photoconductive layer 12. Therefore, the control means 40 controls the voltage application means and the band-gap light irradiation means 30 such that an amount of hole-current density greater than or equal to $1\times10^{-6}$ A/cm$^2$ flows through the photoconductive layer 12.

By constructing the radiation image recording/readout apparatus 1 in the manner as described above, the residual charges accumulated in the solid state radiation detector 10 may be erased effectively.

So far the exemplary embodiment of the present has been described, but the present invention is not limited to the TFT readout type solid state radiation detector. The present invention may be applied to various types of solid state radiation detectors, including the optical readout type solid state radiation detector as described in U.S. Pat. No. 6,268,614 and the like.

Further, the present invention is not limited to the direct conversion type solid state radiation detector that directly converts the radiation to charge pairs in the photoconductive layer. The present invention may also be applied to the photoelectric conversion type solid state detector that converts the irradiated radiation to fluorescent light through a scintillator first, and then detects the radiation image by detecting the fluorescent light.

What is claimed is:

1. A residual charge erasing method for a solid state radiation detector which includes an electrostatic recording section having a photoconductive layer that shows conductivity when exposed to recording light, and is constructed to receive recording light representing image information to record the image information therein and to output image signals representing the recorded image information,
    wherein residual charges remaining in the solid state radiation detector are erased by passing an amount of major carrier through the photoconductive layer, the amount of major carrier being greater than or equal to an amount of current that flows through the photoconductive layer at the time of recording.

2. The residual charge erasing method for a solid state radiation detector according to claim 1, wherein:
    the photoconductive layer is formed mainly of amorphous selenium; and residual charges remaining in the solid state radiation detector are erased by passing an amount of hole-current density greater than or equal to $1\times10^{-8}$ A/cm$^2$ through the photoconductive layer.

3. The residual charge erasing method for a solid state radiation detector according to claim 2, wherein residual charges remaining in the solid state radiation detector are erased by passing an amount of hole-current density greater than or equal to $1\times10^{-6}$ A/cm$^2$ through the photoconductive layer.

4. The residual charge erasing method for a solid state radiation detector according to claim 2, wherein amorphous selenium occupies the largest amount in weight percent among the components constituting the photoconductive layer.

5. The residual charge erasing method for a solid state radiation detector according to claim 1, wherein an amount of current that flows through the photoconductive layer at the time of recording is the total amount of major and minor carriers that flow through the area of the photoconductive layer corresponding to the region where no shielding is provided on the side of the solid state radiation detector on which radiation is incident at the time of recording.

6. A radiation image recording/readout apparatus, comprising:
    a solid state radiation detector which includes an electrostatic recording section having a photoconductive layer that shows conductivity when exposed to recording light, and is constructed to receive recording light representing image information to record the image information therein and to output image signals representing the recorded image information;
    a voltage application means for applying a voltage to the photoconductive layer of the solid state radiation detector;
    a band-gap light irradiation means for irradiating band-gap light on the solid state radiation detector; and
    a control means for controlling the voltage application means and band-gap light irradiation means such that an amount of major carrier flows through the photoconductive layer, the amount of major carrier being greater than or equal to an amount of current that flows through the photoconductive layer at the time of recording.

7. The radiation image recording/readout apparatus according to claim 6,
    wherein:
    the photoconductive layer is formed mainly of amorphous selenium; and the control means controls the voltage application means and the band-gap light irradiation means such that an amount of hole-current density greater than or equal to $1\times10^{-8}$ A/cm$^2$ flows through the photoconductive layer.

8. The radiation image recording/readout apparatus according to claim 7, wherein the control means controls the voltage application means and band-gap light irradiation means such that an amount of hole-current density greater than or equal to $1\times10^{-6}$ A/cm$^2$ flows through the photoconductive layer.

9. The radiation image recording/readout apparatus according to claim 7, wherein amorphous selenium occupies the largest amount in weight percent among the components constituting the photoconductive layer.

* * * * *